United States Patent [19]

Dolby

[11] Patent Number: 4,801,890

[45] Date of Patent: Jan. 31, 1989

[54] CIRCUIT ARRANGEMENTS FOR MODIFYING DYNAMIC RANGE USING VARIABLE COMBINING TECHNIQUES

[76] Inventor: Ray M. Dolby, 3340 Jackson St., San Francisco, Calif. 94118

[21] Appl. No.: 871,672

[22] Filed: Jun. 12, 1986

Related U.S. Application Data

[63] Continuation-in-part of Ser. No. 744,964, Jun. 17, 1985, abandoned.

[51] Int. Cl.$^4$ .............................................. H03F 3/68
[52] U.S. Cl. ...................................... 330/126; 333/14
[58] Field of Search ................ 330/84, 126, 149, 151, 330/295; 333/14, 17 R, 17 L; 381/106; 455/72

[56] References Cited

U.S. PATENT DOCUMENTS 3,775,705 11/1973 Dolby ................................... 333/14
4,701,722 10/1987 Dolby ................................... 333/14

Primary Examiner—Steven Mottola
Attorney, Agent, or Firm—Thomas A. Gallagher

[57] ABSTRACT

Circuits for modifying the dynamic range of signals, particularly compressors and expanders for use in noise reduction compander systems, in which the advantages of fixed band characteristics (variable attenuation throughout all or part of the frequency band) and sliding band characteristics (variable attenuation through part of the frequency band achieved by a variable pass filter) are provided, without the disadvantages normally inherent in each characteristic. The outputs of fixed band and sliding band circuit elements variably selected by a combining means operated by a control circuit which senses signal frequencies and/or levels, the elements operating in generally the same level range and at least a partial overlapping in frequency range.

9 Claims, 7 Drawing Sheets

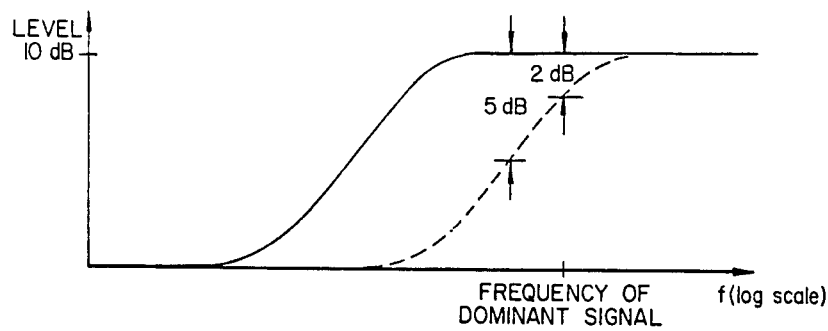
FIG._1. (PRIOR ART)
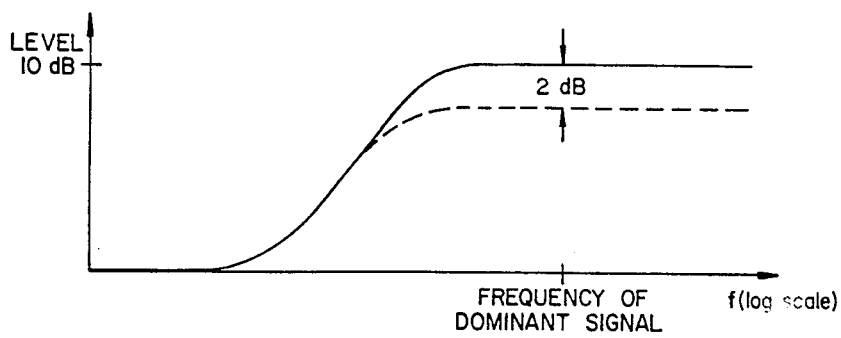
FIG._2. (PRIOR ART)
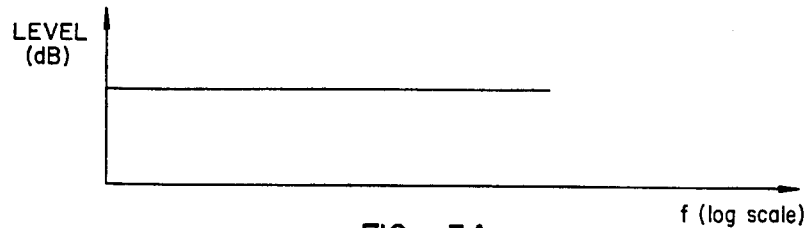
FIG._3A.
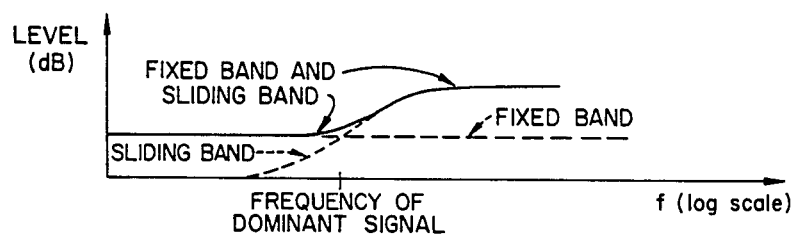
FIG._3B.

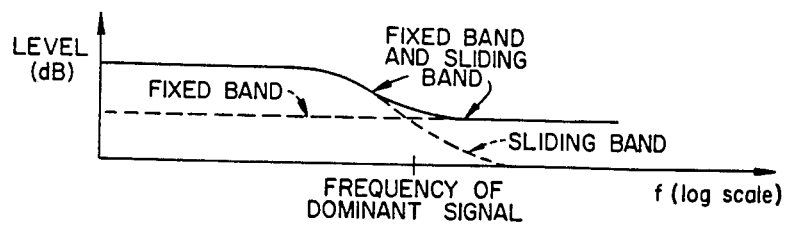
FIG._3C.
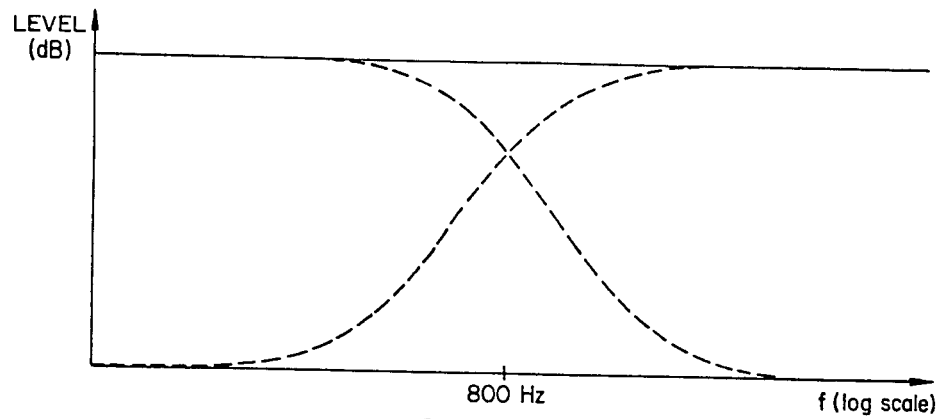
FIG._4A.
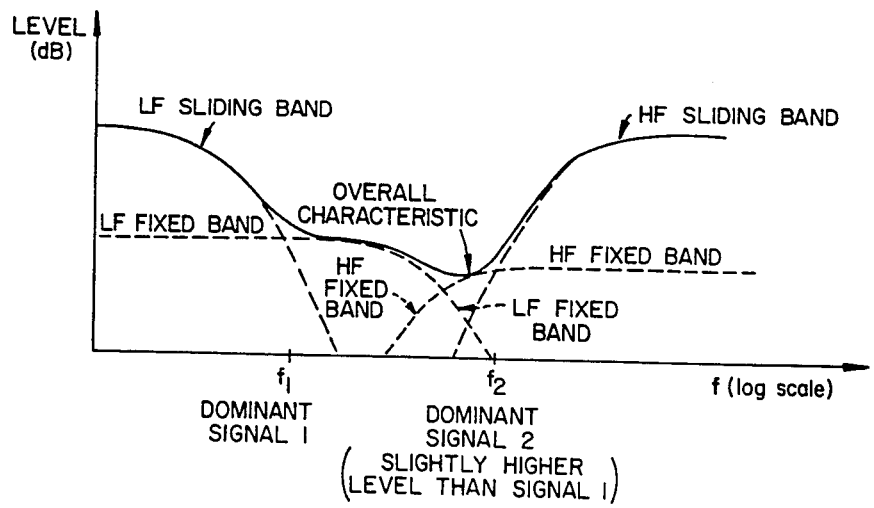
FIG._4B.

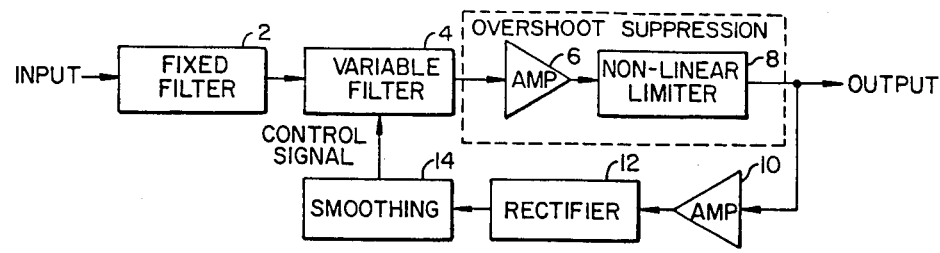
FIG._5. (PRIOR ART)
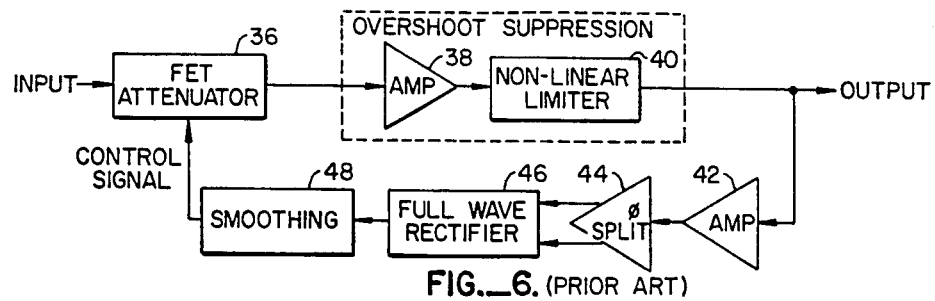
FIG._6. (PRIOR ART)
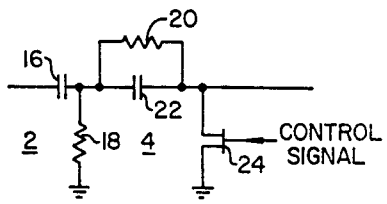
FIG._7. (PRIOR ART)
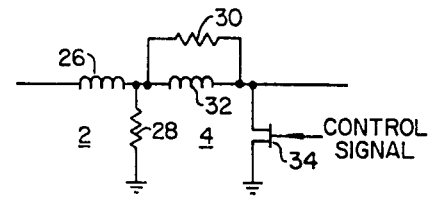
FIG._8. (PRIOR ART)
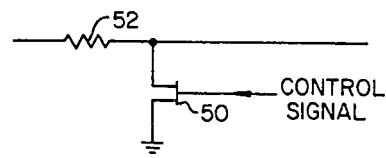
FIG._9. (PRIOR ART)

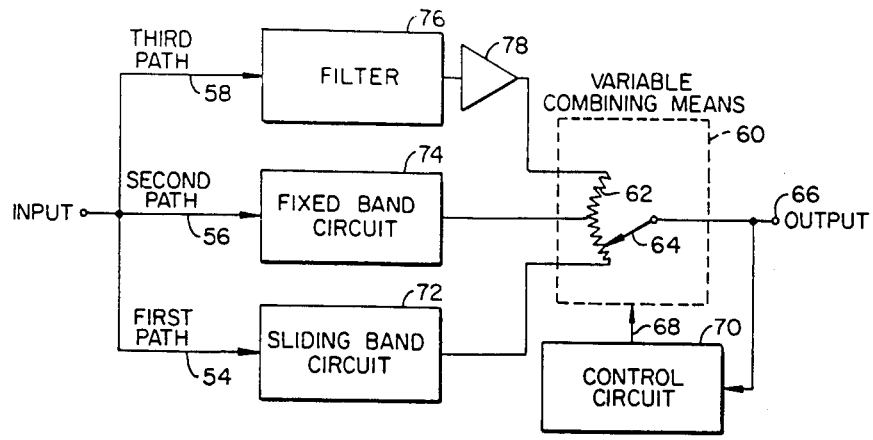
FIG._10.
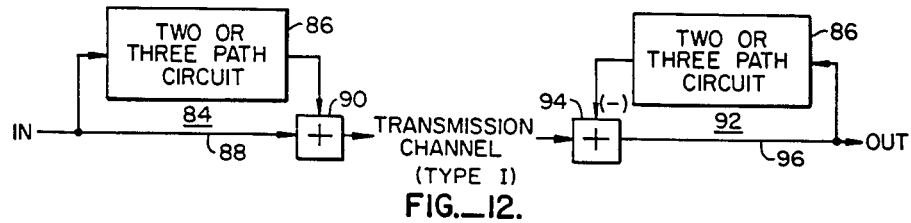
FIG._12.
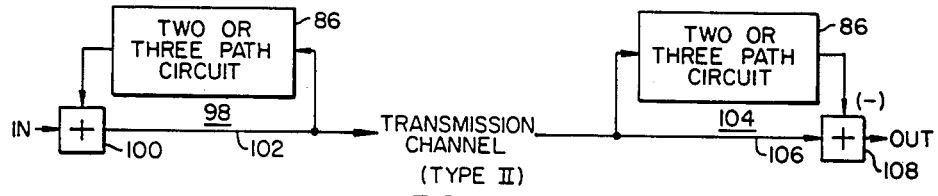
FIG._13.
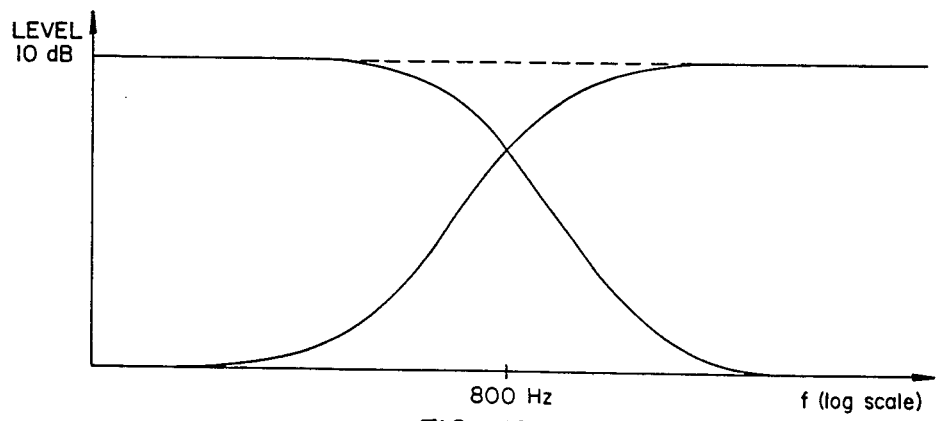
FIG._18.

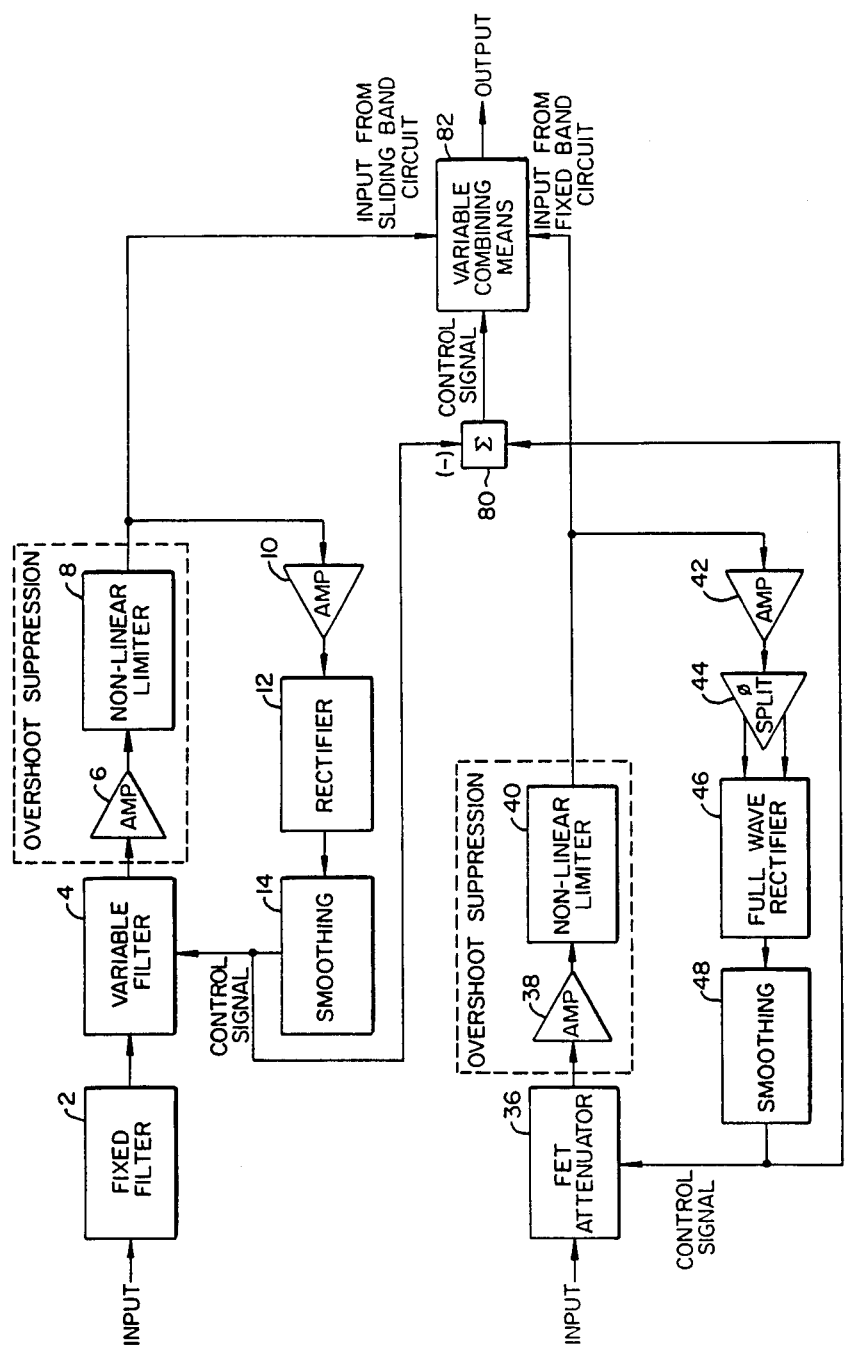
FIG._11.

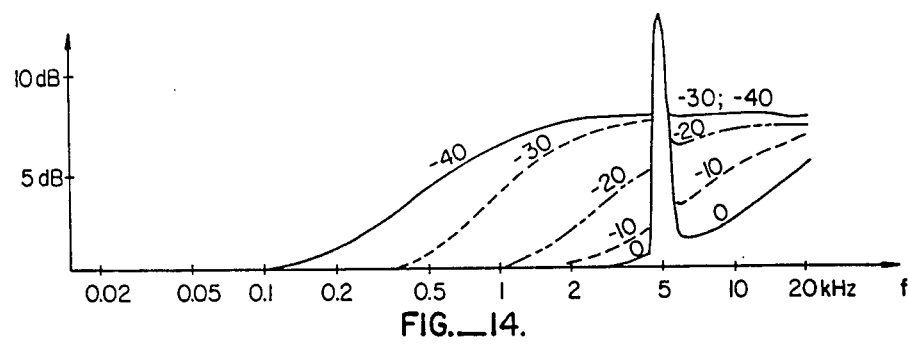
FIG._14.
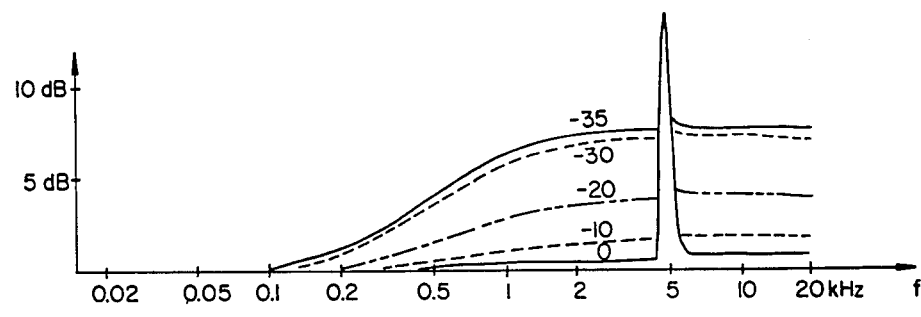
FIG._15.
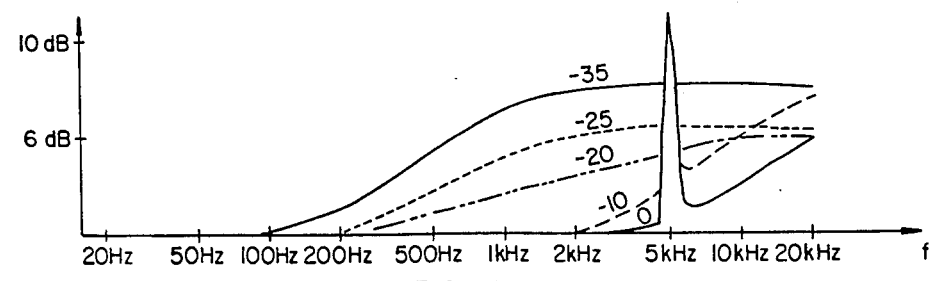
FIG._16.

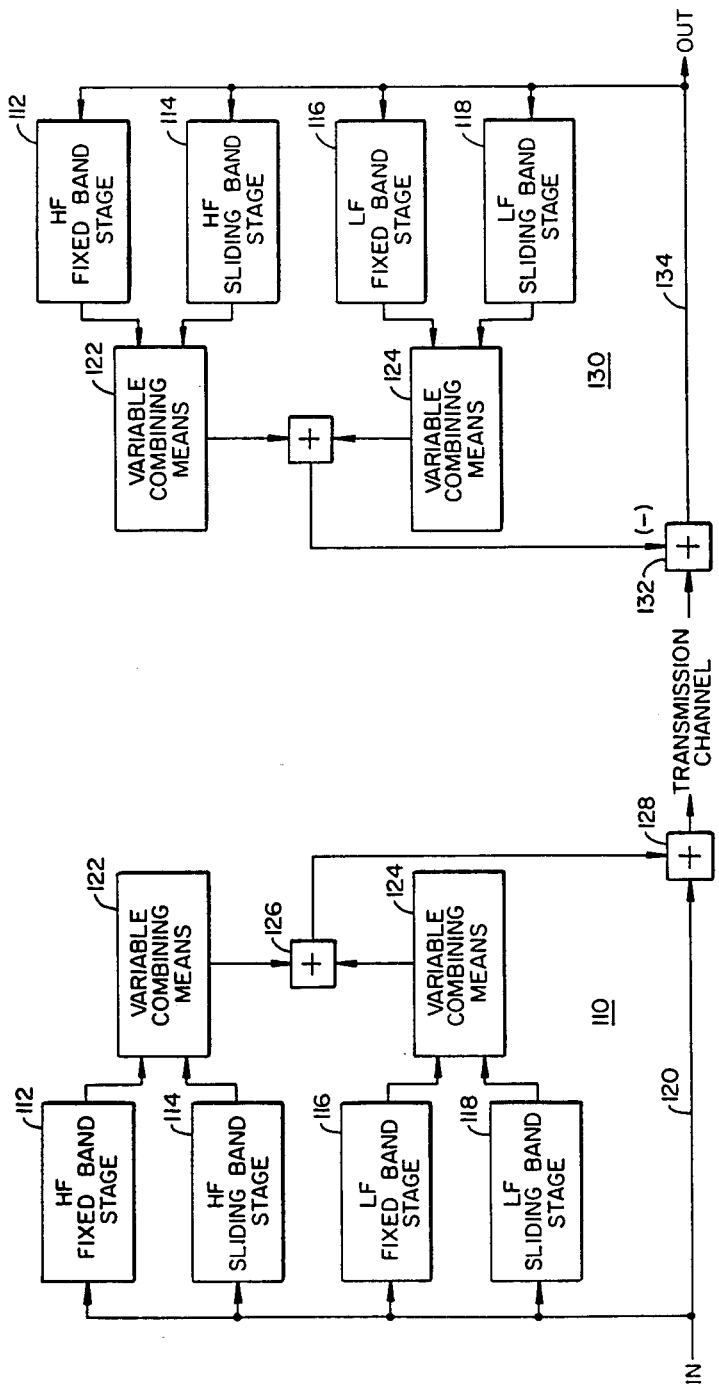
FIG._17.

CIRCUIT ARRANGEMENTS FOR MODIFYING DYNAMIC RANGE USING VARIABLE COMBINING TECHNIQUES

CROSS-REFERENCE TO RELATED APPLICATION

This is a continuation-in-part of copending application Ser. No. 06/744,964, filed June 17, 1985.

BACKGROUND OF THE INVENTION

The present invention is concerned in general with circuit arrangements which alter the dynamic range of signals, namely compressors which compress the dynamic range and expanders which expand the dynamic range. While the invention is useful for treating various types of signals, including audio signals and video (television) signals, the description of the invention is primarily in the context of the processing of audio signals. The principles of the invention may be applied to the processing of other signals by modifying the disclosed embodiments by applying known techniques. For example, compressors and expanders for video signals can act instantaneously and do not require syllabic control circuitry.

Compressors and expanders are normally used together (a compander system) to effect noise reduction; the signal is compressed before transmission or recording and expanded after reception or playback from the transmission channel. However, compressors may be used alone to reduce the dynamic range, e.g., to suit the capacity of a transmission channel, without subsequent expansion when the compressed signal is adequate for the end purpose. In addition, compressors alone are used in certain products, especially audio products which are intended only to transmit or record compressed broadcast or pre-recorded signals. Expanders alone are used in certain products, especially audio products which are intended only to receive or play back already compressed broadcast or pre-recorded signals. In certain products, a single device is often configured for switchable mode operation as a compressor to record signals and as an expander to play back compressed broadcast or pre-recorded signals.

One long sought after goal in the design of compressors, expanders and companding type noise reduction systems is a high degree of adaptiveness of the compressor and expander to applied signals. That is, the compressor, for example, ideally should provide constant gain throughout its frequency spectrum of operation except at the frequency of a dominant signal component where it would provide dynamic action according to a predetermined compression law. This goal was referred to as "conformal equalization" in U.K. Provisional Specification No. 43136 filed 11 Oct. 1965 by this inventor. Accordingly, that document (along with two other U.K. Provisional Specifications of this inventor, Nos. 34394 and 02368, filed 11 Aug. 1965 and 18 Jan. 1966, respectively) and subsequent patents derived therefrom (including U.S. Pat. Nos. 3,846,719 and 3,903,485) employed several techniques directed to achieving that goal, including, among others, techniques now commonly known as "bandsplitting" and "sliding band".

According to the bandsplitting approach, the spectrum is divided into a plurality of frequency bands, each of which is acted upon independently. In that way a dominant signal component affects dynamic action (compression or expansion) only within a portion of the overall spectrum, in contrast to a wideband approach in which dynamic action throughout the entire spectrum is affected by a dominant signal component. Thus, a bandsplitting system provides a greater degree of adaptiveness or conformance than a wideband system. In theory, a highly adaptive or conformal system could be provided by dividing the overall spectrum into a very large number of frequency bands; however, the complexity and cost of such an arrangement makes it impractical. Consequently, a design compromise is made by selecting a reasonable number of frequency bands capable of providing satisfactory performance. In one well known commercially successful bandsplitting companding type audio noise reduction system (commonly known as A-type noise reduction) four bands are employed ("An Audio Noise Reduction System", by Ray Dolby, *J. Audio Eng. Soc.*, October 1967, Vol. 15, No. 4, pp. 383–388). However, such systems suffer from the same problems as does a wideband noise reduction system, although to a lesser degree because the band is divided up and the problems tend to be confined to the individual bands. These problems are well known in the design of noise reduction systems and include loss of noise reduction effect and the related problems of noise modulation and signal modulation at frequencies not masked by the dominant signal component when a change of gain takes place in response to a dominant signal component. Such problems are chiefly a result of a system failing to be perfectly conformant to the dominant signal. The degree to which such problems are audible also depends on how far the system departs from perfect complementarity. If, for example, the transmission channel response is irregular or unpredictable within the passband of the compressor and expander, then signal modulation effects will not be compensated in the expander.

A dominant signal component is a signal component having a substantial enough level so as to effect dynamic action within the frequency band under consideration. Under complex signal conditions there may be more than one dominant signal component or a dominant signal component and sub-dominant signal components. In a compander system which relies on complementarity of the compressor and expander, all of the signal components must be compressed and expanded in accordance with a defined compression/expansion law in order that the signal spectrum including the dominant signal component (and other signals affected by dynamic action) can be restored to their correct levels in the expander. This requirement excludes the usefulness in compander systems of various known adaptive and tracking filter techniques and so-called "single ended" noise reduction systems (which operate only on a reproduced signal) in which the filter action is not subject to predetermined compression/expansion laws and whose action may be unpredictable in the presence of multiple signals.

Another approach useful in working toward the goal of increased adaptiveness or conformance is the sliding band technique, which employs signal dependent variable filtering to achieve limiting. Generally, a dominant signal component causes the cutoff or turnover frequency (or frequencies) of one or more variable filters (e.g., high pass, low pass, shelf, notch, etc.) to shift so as to compress or expand the dominant signal component.

A sliding band system operating only in a single high frequency band is described in U.S. Pat. No. Re. 28,426 and U.S. Pat. No. 4,490,691. This system, which forms the basis for the well known consumer companding type audio noise reduction system known as B-type noise reduction, includes, in a dual path arrangement, a side path having a fixed high pass filter in series with a variable filter.

A "dual path" arrangement is one in which a compression or expansion characteristic is achieved through the use of a main path which is essentially free of dynamic action and one or more secondary or side paths having dynamic action. The side path or paths take their input from the input or output of the main path and their output or outputs are additively or subtractively combined with the main path in order to provide compression or expansion. Generally, a side path provides a type of limiting or variable attenuation and the manner in which it is connected to the main path determines if it boosts (to provide compression) or bucks (to provide expansion) the main path signal components. Such dual path arrangements are described in detail in U.S. Pat. Nos. 3,846,719; 3,903,485; 4,490,691 and U.S. Pat. No. Re. 28,426.

A high frequency variable shelving filter in a single path arrangement (e.g., the dynamic action is accomplished in a single signal path) for a companding audio noise reduction system is set forth in U.S. Pat. No. 3,911,371. In the embodiments of FIGS. 1 and 2 of U.S. Pat. No. 3,665,345 a dual path arrangement is set forth in which the side path comprises a variable shelving filter having an all-pass characteristic in its quiescent condition. Another approach for providing a variable shelving response for compander systems is set forth in U.S. Pat. No. 3,934,190.

One drawback of these sliding band arrangements is that in the presence of a dominant high frequency signal component the variable filter turnover frequency shifts to a frequency above that signal component thereby restricting the frequency area at lower frequencies in which noise reduction is provided. The loss of noise reduction may be more noticeable audibly than in band-splitting systems and the related side effects (noise modulation and signal modulation) may be more severe than in fixed band arrangements because of a multiplication effect that is inherent in sliding band systems. This effect results from the way in which sliding band systems provide compression. If, for example, there is a dominant high frequency signal and 2 dB of gain reduction is required at that frequency, the variable filter cutoff frequency should shift to the extent necessary to provide that amount of attenuation along the filter slope. However, for lower frequencies, further removed from the new filter cutoff frequency, the effect may be 5 or 10 dB of dynamic action, for example, with a consequent loss of all or most of the noise reduction effect along with possible audible signal or noise modulation. In other words, in this example, a 2 dB change in a dominant signal can cause a 5 or 10 dB change in gain at frequencies removed from the dominant signal. FIG. 1 is an idealized compressor characteristic response curve illustrating this effect. (Throughout this document the characteristic response curves illustrated in the various Figures are those of compressors, it being understood that the respective expander characteristic is the complement of the compresor characteristic.) Under relatively rare conditions, when very high frequency dominant signal components (cymbals, for example) control the sliding band filter, there may be audible modulation of non-dominant mid-band signal components that are also present if the expander does not properly track the compressor. This problem is called the "mid-band modulation effect." One approach in solving the problem is set forth in said U.S. Pat. No. 4,490,691.

In a fixed band arrangement the same amount of gain reduction would occur throughout the frequency band (whether wide band or one frequency band of a band-splitting system) in response to a dominant signal component. Thus, while signal or noise modulation may occur, there is no multiplication of the effect: a 2 dB change in the level of a dominant signal component would cause a 2 dB change in gain at frequencies removed from the dominant signal component. However, viewed from the standpoint of noise reduction effect this is a disadvantage of a fixed band arrangement—the full noise reduction effect is not obtained anywhere within the frequency band of operation when limiting occurs in response to a dominant signal component. FIG. 2 illustrates this effect. Although it is not multiplied, there is also the potential for noise and signal modulation throughout the entire frequency band in which the fixed band action occurs.

Despite the disadvantages mentioned, an advantage of a sliding band arrangement is that the full noise reduction effect is obtained at frequencies above the dominant signal component (or below the dominant signal component in the case of a sliding band system acting downward in frequency). Thus an arrangement that achieves the advantages of fixed band and sliding band systems (e.g., the advantage of fixed band is that there is no multiplication of modulation effects and the advantage of sliding band is that there is minimum signal or noise modulation above the dominant signal frequency) without the disadvantages of each (e.g., the disadvantage of fixed band is noise and signal modulation throughout its operating range—although not multiplied and the disadvantage of sliding band is the mid-band modulation effect) would be desirable.

Although it is known to employ fixed band and sliding band actions in separate frequency bands of band-splitting arrangements and to employ more than one dynamic action within the same frequency band, prior art arrangements have not obtained the above noted advantages of fixed band and sliding band action by employing those actions simultaneously in substantially the same frequency band.

SUMMARY OF THE INVENTION

The present invention is based on the recognition that the ideal of conformal equalization can be more closely approached by compressor, expander and compander type noise reduction arrangements in which a plurality of characteristic actions are variably selected in response to dominant signal components.

The invention allows the designer of compressors, expanders and companding noise reduction systems greater flexibility in building up response characteristics without resorting to undue circuit complexity.

The voltage transfer function for a two path variable combining arrangement can be expressed by $$V_{out} = V_{in}[kt_1(s) + (1-k)t_2(s)],$$

where $V_{in}$ is the applied voltage, $V_{out}$ is the output voltage, $t_1(s)$ and $t_2(s)$ are the transfer functions of each path and, k and $1-k$ express the ratio of each path, assuming a simple potentiometer type combining means.

Although the invention is applicable generally to combinations of elements having various dynamic and passive characteristics, a very useful combination of characteristics in practice and for the purposes of explanation is the variable selection of a fixed band dynamic characteristic and a sliding band dynamic characteristic. By applying the teachings of the present invention the advantages of both characteristics can be obtained while avoiding their disadvantages. Thus, if a sliding band characteristic and a fixed band characteristic are variably selectable in substantially the same frequency range (wide band or a defined band) and level range, the quiescent characteristic of the combination appears the same as the quiescent characteristic of either one taken alone because the two quiescent characteristics are the same. When a dominant signal component appears within their frequency range each characteristic reacts—the fixed band characteristic drops uniformly in level across the frequency range and the sliding band characteristic begins to slide.

However, the two actions are no longer independent: the two characteristics are tied together by the variable combining means which selects an amplitude portion of each according to the arrangement of its control circuit. In the case of a variable action selection arrangement selecting between a fixed band characteristic and a sliding band characteristic in which the variable filter slides upward in frequency, the action selection control circuit will preferably select more and more of the sliding band characteristic with increasing levels of high level high frequency dominant signals. As these changes occur the two characteristics, which appeared as one characteristic in the quiescent condition (FIG. 3A), are now revealed: the combined characteristic appears as that of a sliding band characteristic above (or below, depending on whether the sliding band acts upwardly or downwardly in frequency) the frequency of the dominant signal and it appears as a fixed band characteristic below (or above) the frequency of the dominant signal. FIG. 3B shows an example in which the sliding band is above the dominant signal and FIG. 3C shows an example in which the sliding band is below the dominant signal. Two regimes of operation are revealed, divided at the frequency of the dominant signal. Thus, the region which the sliding band characteristic would have left "uncovered" is supplemented by the fixed band characteristic which, in effect, provides a floor or foundation level. In other words, there is a variable selection of action in response to the dominant signal component. The result is to obtain the advantages of both fixed band and sliding band arrangements while avoiding their disadvantages. Maximum noise reduction effect and minimum modulation effects are obtained above (or below) the dominant signal where the sliding band characteristic operates while avoiding the loss of noise reduction and the creation of signal modulation and noise modulation effects below (or above) the dominant signal by the presence of the fixed band characteristic. Thus, there is no multiplication effect below (or above) the dominant frequency as would occur if the sliding band characteristic were operating alone, while obtaining the advantages of the sliding band characteristic above (or below) the dominant frequency, although with the characteristics at less than their maximum values in the ranges in which they are effective.

An even more adaptive arrangement can be achieved by providing a bandsplitting arrangement in which the high frequency band and low frequency band are each comprised by variable action selection fixed band/sliding band characteristics. In the high frequency band the sliding band acts upwardly in frequency while in the low frequency band the sliding band acts downwardly in frequency. In the quiescent condition the characteristics overlap so as to provide a flat overall characteristic. By choosing gentle filter slopes (say, 6 dB/octave) and a common quiescent corner frequency in the middle of the frequency band (say, 800 Hz for an audio system), excellent tracking of a dominant signal by both the high and low frequency bands throughout a substantial portion of the band under processing is possible. The quiescent response of such an arrangement is shown in FIG. 4A. The presence of two dominant signals results in a fixed band response between the dominant signals and sliding band response at frequencies above and below their frequencies where maximum noise reduction is most critical (FIG. 4B).

BRIEF DESCRIPTION OF THE DRAWINGS

FIG. 1 is an idealized compressor characteristic response curve illustrating the prior art sliding band multiplication effect.

FIG. 2 is an idealized compressor characteristic response curve illustrating the prior art fixed band limiting effect.

FIG. 3A is an idealized compressor characteristic response curve showing the quiescent response of variable action selection fixed band and sliding band elements in accordance with the invention.

FIG. 3B is an idealized compressor characteristic response curve showing the response slightly above their thresholds of variable action selection fixed band and sliding band elements in accordance with the invention, the sliding band acting upward in frequency.

FIG. 3C is an idealized compressor characteristic response curve showing the response slightly above their thresholds of variable action selection fixed band and sliding band elements in accordance with the invention, the sliding band acting downward in frequency.

FIG. 4A is an idealized compressor characteristic response curve showing the quiescent response of high frequency and low frequency circuits, each having variable action selection fixed band and sliding band elements in accordance with the invention, the circuits having a common corner frequency of 800 Hz.

FIG. 4B is an idealized compresor characteristic response curve showing the response in the presence of two dominant signals of the same high frequency and low frequency circuits referred to in connection with FIG. 4A.

FIG. 5 is a block diagram of a prior art sliding band circuit.

FIG. 6 is a block diagram of a prior art fixed band circuit.

FIG. 7 is a schematic diagram of filters usable in the circuit of FIG. 5.

FIG. 8 is a schematic diagram of further filters usable in the circuit of FIG. 5.

FIG. 9 is a schematic diagram of an FET attenuator usable in the circuit of FIG. 6.

FIG. 10 is a block diagram showing a generalized embodiment of the present invention.

FIG. 11 is a block diagram showing a further generalized embodiment of the present invention.

FIG. 12 is a block diagram showing a Type I dual path arrangement employing variable action selection stages of the type described in connection with FIGS. 10 and 11.

FIG. 13 is a block diagram showing a Type II dual path arrangement employing variable action selection stages of the type described in connection with FIGS. 10 and 11.

FIG. 14 shows a set of curves relating to the compressor response of a sliding band circuit.

FIG. 15 shows a set of curves relating to the compressor response of a fixed band circuit.

FIG. 16 shows a set of curves relating to the compressor response of a variable action selection circuit having sliding band and fixed band characteristic action inputs.

FIG. 17 is a block diagram showing a Type I dual path arrangement employing variable action selection high frequency and low frequency stages.

FIG. 18 is a characteristic response curve relating to the arrangements of FIG. 17.

DETAILED DESCRIPTION OF THE INVENTION

Sliding band and fixed band circuits suitable for use in compressors and expanders are well known, per se, in the art. FIG. 5 shows a block diagram of a prior art sliding band circuit for processing audio signals which is usable in several ways: as a single path compressor (as shown), as a single path expander (by placing the circuit in the feed-back loop of an operational amplifier), as a side path of a dual path compressor, or as a side path of a dual path expander. Circuit details of a high frequency sliding band arrangement in accordance with the block diagram of FIG. 5 are set forth in U.S. Pat. No. Re. 28,426; U.S. Pat. Nos. 4,490,691; and 4,498,060.

FIG. 6 shows a block diagram of a prior art fixed band circuit for processing audio signals which is usable in the same ways as a compressor or expander either in a single path arrangement or in a side path of a dual path arrangement. Circuit details of fixed band arrangements in accordance with the block diagram of FIG. 6 are set forth in U.S. Pat. Nos. 3,846,719; 3,903,485; and 4,498,060.

The sliding band and fixed band circuit elements useful in the present invention are not limited to the processing of audio signals and include not only circuits of the type just mentioned, but also known modifications of such circuits, such as set forth in U.S. Pat. No. 4,490,691, and other known sliding band and fixed band circuits and their equivalents, including, for example, the sliding band arrangements of U.S. Pat. Nos. 3,846,719; 3,903,485; 3,911,371; 3,934,190; 4,306,201; 4,363,006; and 4,363,007, and the fixed band arrangements of U.S. Pat. Nos. 4,306,201 and 4,363,007. The cited patent specifications include details regarding the operation of such circuits as compressors and expanders in dual path arrangements and the operation of compressors as complementary expanders by placing them in the feedback loop of operational amplifiers.

Referring to FIG. 5, the sliding band circuit is shown having a fixed filter 2, a variable filter 4, an amplifier 6 the output of which is coupled to a non-linear limiter 8 for suppressing overshoots. The output of the overshoot suppression stage provides the circuit output and is also applied to a control circuit having an amplifier 10 the output of which is applied to a half-wave rectifier 12 and integrated by a smoothing filter 14 to provide a control signal for the variable filter 4. The fixed filter 2 may be implemented by a simple single pole RC filter.

The variable filter 4 may also be implemented by a simple single pole RC filter in which the source-drain path of a field effect transistor (FET) is operated as a variable resistor by a control voltage applied to the FET gate.

FIG. 7 shows a fixed and variable filter arrangement for a high frequency sliding band circuit in which the cutoff frequency of the variable filter 4 moves upward in response to increasing control signal voltage level. FIG. 8 shows a fixed and variable filter arrangement for a low frequency sliding band circuit in which the cutoff frequency of the variable filter 4 moves downward in response to increasing control signal voltage level. In FIG. 7, the fixed filter is defined by series capacitor 16 and shunt resistor 18 and the variable filter 4 is defined by the parallel arrangement of resistor 20 and capacitor 22 in series and the shunt FET 24 receiving the control signal at its gate. Capacitor 16 and resistor 18 constitute a high pass filter, while resistor 20, capacitor 22 and FET 24 constitute a high pass shelving filter. Although resistor 20 can be omitted (changing variable filter 4 into a variable high pass filter), the inclusion of resistor 20 is useful in avoiding large phase shifts through the filters. In FIG. 8, the fixed filter is defined by series inductor 26 and shunt resistor 28 and the variable filter 4 is defined by the parallel arrangement of resistor 30 and inductor 32 in series and the shunt FET 24 receiving the control signal at its base. Inductor 26 and resistor 28 constitute a low pass filter, while resistor 30, inductor 32 and FET 24 constitute a low pass shelving filter. Resistor 30 serves the same purpose as does resistor 20 in the circuit of FIG. 7. In practice, inductor 26 and resistor 28 would be replaced by a series resistor and shunt capacitor; non-grounded inductor 32 can be simulated by well known gyrator circuits employing operational amplifiers.

In the arrangements of FIGS. 7 and 8, under quiescent conditions the FET is pinched off and the variable filter 4 becomes an all pass filter: the fixed filter 2 thus determines the frequency response of the circuit. Under signal conditions as the FET begins to conduct, the variable filter corner frequency rises and when it is above the corner frequency of the fixed filter it determines the frequency response of the circuit. The fixed filter 2 of the arrangements of FIGS. 5, 6, 7 and 8 can be omitted if desired, however, the additional sharpness of the overall filter characteristic that occurs when the variable filter corner frequency is near that of the fixed filter is a desirable characteristic.

Returning to the description of FIG. 5, the amplifier 10 preferably includes frequency weighting in order to provide increased gain at high frequencies, in the case of a high frequency circuit, or at low frequencies, in the case of a low frequency circuit, in order that the circuit provides sufficient band narrowing (by sliding of the variable filter corner frequency) so as to create the necessary attenuation. The smoothing filter 14 provides the appropriate attack and decay time constants for treating audio signals (e.g., syllabic control).

Referring now to FIG. 6, the fixed band circuit is shown having a FET attenuator 36, an amplifier 38 the output of which is coupled to a non-linear limiter 40 for suppressing overshoots. Amplifier 38 and limiter 40 are the same as amplifier 6 and limiter 8 of FIG. 5. The output of the overshoot suppression stage provides the circuit output and is also applied to a control circuit having an amplifier 42 the output of which is applied to a phase splitter 44 which drives a full-wave rectifier 46 and is integrated by a smoothing filter 48. Full-wave rectification may also be employed in the sliding band arrangement of FIG. 5 and alternatively, the half-wave rectification of FIG. 5 may be employed in the fixed band arrangement of FIG. 6. Full-wave rectification provides a more accurate control signal but at greater expense. The FET attenuator is configured as a simple voltage divider as shown in FIG. 9. The source-drain path of the FET acts as a variable resistor in shunt with series resistor 52. The circuit thus provides wide band variable attenuation. By placing a band defining filter in series with the input before the FET attenuator 36 of FIG. 6, the fixed band is effective only within the frequency band defined by the filter.

FIG. 10 shows a generalized embodiment of a variable action selection arrangement according to the invention which employs three different paths 54, 56, and 58. The outputs of the paths are combined in variable proportions by a variable combining means 60 illustrated as a resistor 62 with taps connected to the outputs of the three paths and an adjustable wiper 64 connected to the output terminal 66. The position of wiper 64 is adjusted in response to the signal on line 68 from the control circuit 70, which is shown as sensing the level of the output signal purely by way of example. The wiper 64 is shown in mechanical terms for clarity, although it will be appreciated that a purely electronic arrangement can be employed. In accordance with the present invention two of the three paths, respectively, contain sliding band and fixed band circuits 72 and 74 of the type described above in connection with FIGS. 5 through 9. The third path may contain a passive filter 76 and, optionally, a buffer amplifier 78 to isolate the passive filter from the variable combining means. It may be possible to obtain useful results by adding a fourth path also containing a passive filter and, optionally, a buffer amplifier to isolate the passive filter from the variable combining means. The range of signal levels at which the respective fixed band and sliding band compressors and expanders provide dynamic action is substantially the same; within a few decibels. The compressors and complementary expanders may be any of the devices mentioned above.

Further details of a control circuit usable with the variable combining coupling means of FIG. 10 is set forth in U.S. Pat. No. 3,775,705 in FIG. 3 thereof and the related portions of the specification.

FIG. 11 shows the general arrangement of a further embodiment which employs sliding band and fixed band circuits such as shown in FIGS. 5 and 6, respectively. The same reference numerals are used for elements common to FIGS. 5 and 6. In the embodiment of FIG. 11 the DC control signals from the respective sliding band and fixed band circuits are combined in opposition in combining means 80 to provide a control signal for the variable combining means 82 which variably selects proportions of the outputs of the sliding band and fixed band circuits to provide the overall output. In a practical embodiment, the variable combining means 82 may be implemented by a resistive divider network in which the variable element is the source-drain path of a FET, a DC control signal being applied to its base in order to control the resistance of that path. The combining means 80 may be implemented by an operational amplifier having the DC control signal from one circuit applied to one of its inputs and the DC control signal from the other circuit applied to the other of its inputs (i.e., subtractively). Adjustment of the amplifier gain and attenuation of the DC control signals (as by potentiometers in the lines carrying the DC control signals) would provide control of the relative level of DC control signals at which the output crosses over from sliding band to fixed band operation and vice-versa. The curves of FIGS. 14 through 16, described below, are useful in understanding the changeover from one regime of operation to another.

FIG. 12 shows one general arrangement of a compander system in accordance with the invention in which the two and three path circuits, such as those described in connection with FIGS. 10 and 11, are located in the side paths of a Type I dual path compander system (of the type generally described in U.S. Pat. No. 3,846,719). The arrangement has a compressor 84 in which the input signal is applied to the two or three path circuit 86 and to the main path 88. The output of circuit 86 is added to the main path signal components in summing means 90 to provide the compressor output for application to a transmission channel. The side path signal components thus boost the main path signal components causing compressor action. The transmission channel output is applied to the expander 92, configured in a complementary manner to the compressor 84, which has an input summing means 94 which receives the transmission channel output and subtracts the output of the two or three path circuit 86. The side path signal components thus buck the main path signal components causing expander action. The summing means 94 has its output applied to the main path 96 which provides the expander output and the input to circuit 86.

In FIG. 13, a Type II dual path arrangement (of the type generally described in U.S. Pat. No. 3,903,485) is shown having a compressor 98 which has an input summing means 100 receiving the input signal and the output of the two or three path circuit 86. The summing means 100 has its output applied to the main path 102 which provides the compressor output to the transmission channel and the input to circuit 86 of the compressor. The side path signal components thus boost the main path signal components causing compressor action. The transmission channel output is applied to the expander 104, configured in a complementary manner to the compressor 98. The input signal is applied to the two or three path circuit 86 and to the main path 106. The output of circuit 86 is subtracted from the main path signal components in summing means 108 to provide the expander output. The side path signal components thus buck the main path signal components causing expander action.

FIGS. 14, 15, and 16 are compression curves representing signal conditions in an arrangement such as the dual path Type I compressor of FIG. 12 in which the circuit 86 is generally as shown in the embodiment of FIG. 11. In addition, the sliding band element is of the type that shifts upward in response to signal conditions. Both the sliding band and fixed band elements have fixed single pole high pass input filters having a corner frequency of 800 Hz. (Such a filter is not shown in FIG. 11 for the fixed band portion of the circuit). Both circuits have a threshold of about −35 dB relative to a reference level which is taken to be about 20 dB below the maximum level in the system. Each set of curves shows the response of such a circuit when a −50 dB probe tone is swept through the range of 20 Hz to 20 kHz in the presence of a 5 kHz tone, for tone levels ranging from 0 dB to −35 or −40 dB.

FIG. 14 shows the responses at the output of the sliding band circuit. The curves illustrate the shifting of the variable filter cutoff frequency upward as the 5 kHz dominant signal increases in level.

FIG. 15 shows the responses at the output of the fixed band circuit. The curves illustrate the flattening of the fixed band responses, the increased attenuation, as the 5 kHz dominant signal increases in level. FIG. 16 shows the responses at output of the variable combining means. The curves illustrate that at the high level extremes (0 and −10 dB) of the dominant signal that the response is essentially that of the sliding band circuit. At lower levels (−20 through −35 dB) of the dominant signal, the response becomes more like that of the fixed band circuit. This is the desired result: the mid-band modulation effect is reduced (compare FIG. 16 to FIG. 14 in the 500 to 1 kHz range for example—the sliding band response would strongly affect low level signals in that region for levels of the dominant signal just above the threshold level) while more noise reduction effect is obtained at high frequencies for high dominant signal levels (compare FIG. 16 to FIG. 15 above 5 kHz).

As mentioned above, a very useful arrangement is to provide a compressor or expander configured in the nature of bandsplitting high frequency and low frequency bands, each band made up of two path variable action selection stages having sliding band and fixed band circuits in their respective paths. The variable action selection stages can operate as stand alone dynamic range modification devices or as side paths in Type I or Type II dual path arrangements such as described in U.S. Pat. Nos. 3,846,719; 3,903,485; U.S. Pat. No. Re. 28,426; and U.S. Pat. No. 4,490,691. Preferably, single pole filters with the same corner frequency in each are employed so that the combined quiescent response of the circuits is flat. An advantageous corner frequency for the high and low frequency stages is about 800 Hz for an audio system. With the gently sloping 6 dB/octave slope of the filters, if the high frequency stages have a corner frequency of 800 Hz, significant action as low as 100 or 200 Hz is provided. If the low frequency stage also has a corner frequency of 800 Hz, significant action as high as 3 kHz to 6 kHz is provided. Thus, for signals lying in the range of, say 100 Hz to 6 kHz, which is the band having most of the energy in typical music, the high and low frequency stages are effective and provide a signal tracking effect. For example, as explained further below, for a single dominant signal in that range, the overall response is that of two sliding bands, above and below the dominant signal. For more than one dominant signal the response is a fixed band between the most upper and most lower dominant signals and sliding band responses above and below the most upper and most lower dominant signals, respectively.

FIG. 17 shows a bandsplitting arrangement of the type just described. The same corner frequency preferably is used for all of the fixed band and sliding band stages (the quiescent corner frequency in the case of the sliding band stages). The high frequency sliding band stages should operate such that their corner frequency slides upward from the quiescent frequency as signal levels rise. The low frequency sliding band stages should operate such that their corner frequency slides downward from the quiescent frequency as signal levels rise. Although the arrangement of FIG. 17 is shown as a Type I compander, a Type II configuration may also be used. The arrangement has a compressor 110 in which the input signal is applied to the high frequency fixed band stage 112, to the high frequency sliding band stage 114, to the low frequency fixed band stage 116, to the low frequency sliding band stage 118, and to the main path 120. The outputs of stages 112 and 114 are applied to variable combining means 122 and the outputs of stages 116 and 118 are applied to variable combining means 124. The outputs of variable combining means 122 and 124 are added in summing means 126 and that summed output is applied to summing means 128 which combines those signal components with the main path signal components to provide the compressor output for application to a transmission channel. The side path signal components thus boost the main path signal components causing compressor action. The transmission channel output is applied to the expander 130, configured in a complementary manner to the compressor 110, which has an input summing means 132 which receives the transmission channel output and subtracts the sum of the high frequency variable combining means 122 (to which the high frequency fixed band stage 112 and high frequency sliding band stage 114 outputs are applied) and the low frequency variable combining means 124 (to which the low frequency fixed band stage 116 and low frequency sliding band stage 118 outputs are applied) outputs which are combined in summing means 126. The side path signal components thus buck the main path signal components causing expander action. The summing means 132 has its output applied to the main path 134 which provides the expander output and the input to the stages 112, 114, 116, and 118.

In FIGS. 12, 13 and 17 the main path of each compressor and expander is linear with respect to dynamic range and the level of the sum of the side path stages is generally less than the maximum level of the main path. The transmission channel in those Figures may include any type of storage or transmission medium and may also include means for converting or encoding the analog signal components from the compressor into a different form (digital, for example), the storage or transmission of the encoded signals, and means for reconverting or decoding the encoded signals back into analog signal components.

FIG. 18 is a representation of the quiescent characteristics of the compressor 120 of the arrangement of FIG. 17. Each stage 104, 106, 108, and 110 provides a maximum of 10 dB of compression for low level signal conditions below threshold. Thus, the curves show the additive effect of the low frequency and high frequency stages. A common corner frequency of 800 Hz for all four stages is assumed. The curves also illustrate the substantial overlap of the 6 dB/octave skirts of the single pole filters.

It is preferred that the control signal for the variable combining means (60 of FIG. 10; 82 of FIG. 11; 122 and 124 of FIG. 17) is responsive to the amplitude and/or frequency (spectrally dependent) of signals at various places in the overall circuit in which the variable combining means operates. In the example of FIG. 10, the control signal is responsive to the output signal of the variable combining means 60. Band defining filters and rectifiers produce dc control signals that are appropriately combined and used to control the variable combining means.

In FIG. 11, the control signal for the variable combining means 82 is derived from the difference between the sliding band circuit and fixed band circuit control signals, which are in turn derived from the output of the respective sliding band and fixed band circuits. Accordingly, the control signal to the variable combining means 82 is frequency and amplitude dependent because amplifier 10 in the sliding band control circuit preferably has high frequency weighting. When the fixed band control signal increases relative to the sliding band control signal, the control signal from the circuit 80 increases and causes the variable combining means 82 to increase the contribution from the sliding band circuit to the output relative to the contribution from the fixed band circuit.

Each variable combining means in FIG. 17 may be controlled in the same way as in FIG. 11 by means of a respective control signal derived from the respective fixed band and sliding band stages.

A further alternative is to derive a control signal for the variable combining means that is independent of amplitude and is dependent only on frequency. One method for deriving such a control signal is to normalize the input signal using a conventional infinite compressor or linear limiter so that the level is substantially constant, and then to feed this normalized signal via a frequency dependent network (a 6 dB/octave falling characteristic) to a rectifier, whose output will therefore depend on the frequency content of the input signal, independent of its amplitude. Other, more complex arrangements are possible.

As mentioned above, the control signal may be derived from various signals in various locations in the overall circuitry, including the input, the output, or internally between the input and output. Regardless of where the signal is derived from, the control signal will vary in dependence uon the amplitude and/or frequency content of the input signal. In addition, the control signal for the variable combining means may be derived by using a separate circuit (such as block 70 in FIG. 10) or by processing control signals present in sub-circuits as done in the arrangement of FIG. 11.

The voltage transfer functions for a two path variable combining arrangement expressed above is applicable to the embodiment of FIG. 11, in which case the factor "k" (and consequently the ratios "k" and "1−k") is varied in response to the control signal from block 80. The transfer functions $t_1(\Delta)$ and $t_2(\Delta)$ represent the respective sliding band and fixed band circuit functions of FIG. 11.

I claim:

1. A circuit for modifying the dynamic range of an input signal, comprising:
    signal responsive variable gain circuit means having its own dynamic response characteristic,
    signal responsive variable pass filter circuit means having its own dynamic response characteristic,
    means for coupling the input signal to each of said circuit means, and
    means for deriving an output signal having a dynamic response characteristic built up from said circuit means' own response characteristics by variably selecting signal components from each of said circuit means.

2. A circuit according to claim 1 wherein at least one of said circuit means operates in a restricted frequency band, the circuit means operating within at least a substantially overlapping frequency range during quiescent conditions.

3. A circuit according to claim 1 further comprising passive filter circuit means and wherein the means for coupling also couples the input signal to the passive filter circuit means and the means for deriving an output signal can also select signal components from the passive filter circuit means.

4. A circuit according to claim 1 wherein said variable gain circuit means includes first and second variable gain circuits, each having a band defining filter, the filters having a substantially identical cutoff frequency, the band defining filter included with said first variable gain circuit defining a band in the lower portion of the frequency spectrum of the input signal and the band defining filter included with said second variable gain circuit defining a band in the upper portion of the frequency spectrum of the input signal, and wherein said variable pass filter circuit means includes first and second variable pass filter circuits, the quiescent filter characteristic of said first variable pass filter circuit defining a band substantially the same as that defined by the band defining filter of said first variable gain circuit, the quiescent filter characteristic of said second variable pass filter circuit defining a band substantially the same as that defined by the band defining filter of said second variable gain circuit, the first variable pass filter circuit having a cutoff frequency that shifts downward in frequency, and the second variable pass filter circuit having a cutoff frequency that shifts upward in frequency.

5. A circuit according to claim 1 wherein said variable pass filter circuit means has a cutoff frequency that shifts upward in frequency and wherein said means for deriving an output signal by variably selecting selects more and more of the variable pass filter circuit signal components as the level of high level high frequency dominant signal components increases.

6. A circuit according to claim 1 wherein said variable pass filter circuit means has a cutoff frequency that shifts downward in frequency and wherein said means for deriving an output signal by variably selecting selects less and less of the variable pass filter circuit signal components as the level of high level low frequency dominant signal components increases.

7. A method for modifying the dynamic range of input signal components within a frequency band, comprising
    selecting two circuit characteristic actions represented by the voltage transfer functions $t_1(s)$ and $t_2(s)$, wherein one of the transfer function represents a signal responsive variable gain characteristic and the other transfer function represents a signal responsive variable pass filter characteristic, the characteristic actions operating at least partially within substantially the same frequency and level region, and
    operating the circuit characteristics such that when input signal components are applied, represented by the voltage $V_{in}$, the output voltage $V_{out}$ is represented by $$V_{out} = V_{in}[kt_1(s) + (1-k)t_2(s)],$$

where k is a coefficient which varies in dependence upon the amplitude and frequency content of the input signal.

8. A circuit for modifying the dynamic range of input signal components within a frequency band, comprising
    two circuit elements, each having its own characteristic action represented by the voltage transfer functions $t_1(s)$ and $t_2(s)$, respectively, wherein one of the transfer function represents a signal responsive variable gain characteristic and the other transfer function represents a signal responsive variable pass filter characteristic, the characteristic actions operating at least partially within substantially the same frequency and level region, and means for interconnecting the circuit elements such that when input signal components are applied, represented by the voltage $V_{in}$, the output voltage $V_{out}$ is represented by $$V_{out} = V_{in}[kt_1(s) + (1-k)t_2(s)],$$

where k is a coefficient which varies in dependence upon the amplitude and frequency content of the input signal.

9. A circuit according to any of claims 1 to 6, wherein the said means for deriving an output signal effects the variable selection of signal components in dependence upon a control signal which varies in dependence upon the amplitude and frequency content of the input signal.

* * * * *

UNITED STATES PATENT AND TRADEMARK OFFICE
CERTIFICATE OF CORRECTION

PATENT NO. : 4,801,890

DATED : January 31, 1989

INVENTOR(S) : RAY MILTON DOLBY

It is certified that error appears in the above-identified patent and that said Letters Patent is hereby corrected as shown below:

Column 5 :
  Line 17: "react-" should be --reacts--
  Line 18: "s" should be deleted Column 6:
  Line 48: "compresor" should be --compressor--
Column 12:
  Line 67: "berween" should be --between--
Column 13:
  Line 34: "uon" should be --upon--
  Line 59: add --dynamic-- after "own"
Column 14:
  Line 46: "function" should be --functions--
  Line 67: "function" should be --functions--

Signed and Sealed this

Thirty-first Day of October, 1989

*Attest:*

DONALD J. QUIGG

*Attesting Officer*    *Commissioner of Patents and Trademarks*